TELEVISION TUNER

Filed Dec. 13, 1963 2 Sheets-Sheet 1

INVENTOR.
MARVIN A. LEEDOM
BY Eugene M. Whitacre
Attorney

Sept. 6, 1966

M. A. LEEDOM 3,270,571

TELEVISION TUNER

Filed Dec. 13, 1963

2 Sheets-Sheet 2

INVENTOR.
MARVIN A. LEEDOM

BY Eugene M. Whitacre

Attorney

United States Patent Office 3,270,571

Patented Sept. 6, 1966

3,270,571

TELEVISION TUNER

Marvin A. Leedom, Warminster, Pa., assignor to Radio Corporation of America, a corporation of Delaware Filed Dec. 13, 1963, Ser. No. 330,275

9 Claims. (Cl. 74—10.41)

Figure 1:
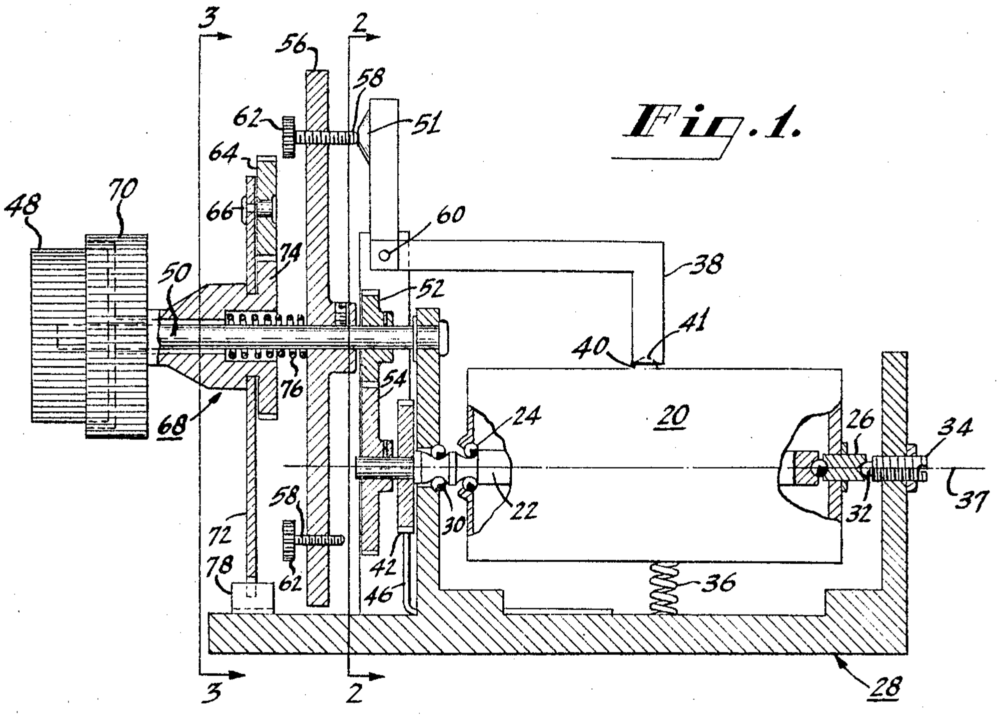

The present invention relates in general to tuning mechanisms and more particularly to step-by-step preset tuning mechanisms for ultra high frequency tuners.

Present authorization for the transmission of television signals includes 12 channels in the very high frequency (VHF) band and 70 channels in the ultra high frequency (UHF) band. Almost all receivers manufactured for home use include step-by-step tuning of the VHF television channels, and continuous tuning of the UHF channels. With increased numbers of UHF stations, it is desirable, from the consumers and the broadcasters points of view, to provide the same general type of tuning operation for UHF channels as for VHF channels and thereby facilitate UHF channel selection. However, a step-by-step tuning of the 70 UHF channels does not present a convenient solution to this problem.

This invention approaches the problem by making the simplifying assumption that the useable UHF signals in any given location will be separated by a predetermined number of channels. For example, it may be presumed that in any given area serviced by more than one UHF station, the channel allocations will be separated by at least four channels. In such a case the UHF tuner may be provided with eighteen equally spaced detent positions each of which is capable of receiving four different UHF channels except for two of the positions which would receive three UHF channels. A preset mechanism may then be provided to select a given one of the channels in any one of the detent positions.

In accordance with the invention, a detent mechanism providing a plurality of equally spaced stop positions is coupled with the tuning control shaft of a continuously tunable UHF tuner. The number of stop positions is selected to be significantly less than the total number of UHF channels so that a plurality of UHF channels can be tuned in at any of the positions. The UHF tuner chassis is mounted for a limited range of movement relative to its tuning control shaft. A preset tuning means driven from the tuning control shaft is operable to move the tuner chassis to a predetermined position relative to the detented position of the main tuning control shaft. Thus, at any of the detent positions the position of the tuner chassis relative to the tuning control shaft is preset to tune the tuner to a desired one of the channel frequencies at that position.

The invention will be further understood from the following description when considered in connection with the accompanying drawings.

Figure 2:
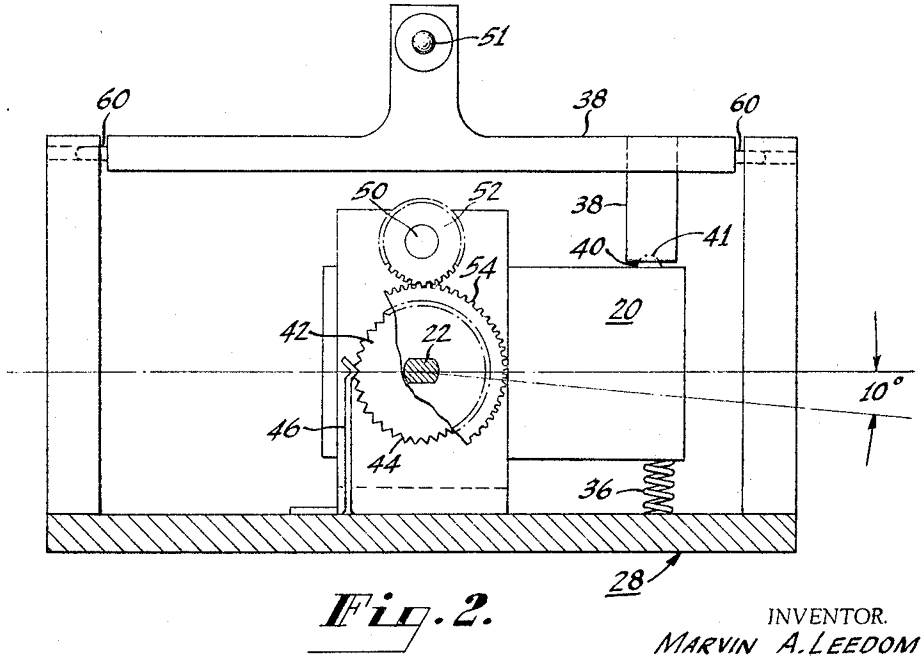
Figure 3:
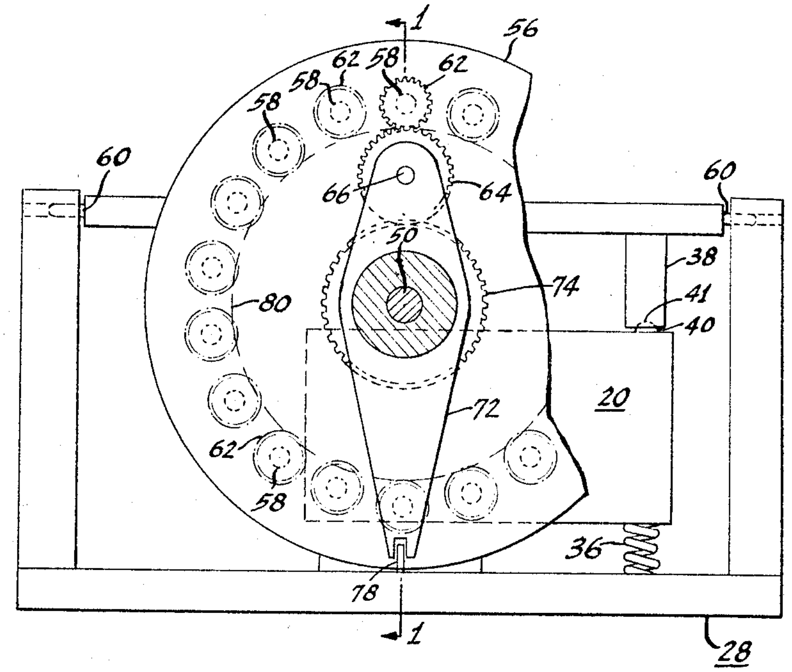

In the drawings:

FIGURE 1 is a partial sectional view taken on section lines 1—1 of FIGURE 3 of a preset tuning mechanism for a UHF television tuner embodying the invention;

FIGURE 2 is a sectional view of the tuning mechanism of FIGURE 1, taken on the section lines 2—2, and showing the operational arrangement and construction of the detent mechanism and the tuner chassis mounting; and FIGURE 3 is a sectional view of the tuning mechanism of FIGURE 1, taken on the section line 3—3, showing the operational arrangement and construction of the preset fine tuning mechanism.

Referring to the drawings wherein like elements and parts are designated by like reference characters throughout the various figures and referring particularly to FIGURE 1, the tuning system includes a continuously tunable UHF television tuner 20 having a control shaft 22 rotatably mounted in the bearings 24 and 26 at opposite ends of the tuner chassis. The tuner 20 is of the type which covers the UHF television band for 180° rotation of the shaft 22. The entire tuner 20 is supported by the control shaft bearings 30 and 32 in a stationary mounting bracket or support means 28. This combination of support bearings 24, 26, 30 and 32 enables both the entire tuner 20 chassis and control shaft 22 to freely rotate with respect to the stationary support means 28. A screw adjustment 34 is used to set the desired bearing pressure for the tuner support bearings 24, 26, 30 and 32.

The means for rotating tuner 20 chassis comprises a pivotally mounted lever or rocker arm 38, which includes a socket 41 for engaging a ball 40 on the tuner 20 chassis. The tuner chassis is spring biased by a coil compression spring 36 positioned between the bracket 28 and the tuner 20 to urge the tuner chassis rotatably supported on the axis 37 toward the rocker arm 38. The movement of the tuner 20 chassis is limited by the spacing between the tuner and the stationary support means 28 and the movement permitted by rocker arm 38. In the present embodiment of the invention, the rotational limitation has been set at about 10 degrees as shown in FIGURE 2.

Rough channel tuning is accomplished by detenting the control shaft 22 by a resilient detent means connected thereto. This is shown by way of example, as a rotating detent plate 42 attached to the control shaft 22. In the present example, there are eighteen equally spaced detent notches 44 provided over 180° of the periphery of the detent plate 42. However, a different number of stop or tuning positions may be provided if desired. A leaf spring 46 bears against the detent plate 42 and co-operates with the spaced detent notches 44 to resiliently stop and hold the tuner shaft 22 in any one of the eighteen positions.

The control shaft 22 is rotated through its detent positions by a control knob 48 mounted on a shaft 50 as shown in FIGURE 1. The shaft 50 is coupled to the tuning control shaft 22 through gears 52 and 54 which provide a two-to-one reduction in rate of rotation. Thus, at a full 360° rotation of the knob 48 will rotate the shaft 22 through 180°; all eighteen detent stop positions. As a result, control knob 48 serves to roughly tune the tuner 20 to that portion of the band in which the desired channel is located.

Once the tuner 20 is tuned to the desired detent position, the desired channel is selected by rotating the entire tuner chassis about the axis 37 of the detented control shaft 22. This is accomplished by the use of a preset mechanism including a rotary turret 56 affixed on the tuning shaft 50 as indicated in FIGURES 1 and 3. The turret 56 carries eighteen equally spaced rotatable tuning adjustment screws 58 extending in a circular row near the periphery thereof and extending in parallel relation to each other. As the turret 56 is rotated with tuning shaft 50 through the various detent positions, the tips of the tuning screws successively come into contact with one end 51 of the fine tuning lever or rocker arm 38. The rocker arm 38 is spring loaded by the spring 36 through the tuner 20 and ball and socket joint 40, 41 to come into contact with the tuning screws as they successively rotate into position.

The heads 62 of the tuning screws 58, are pinion gears which, when turned by an idler gear 64, move screws 58 in or out. The movement of the tuning screw in contact with end 51 of rocker arm 38 pivots the rocker arm about the fulcrum 60. Rocker arm 38, in turn, through ball and socket joint 40, 41, rocks the entire tuner 20 chassis about the axis 37 of the detented control shaft 22 and thereby tunes the tuner 20 to the desired channel at each corresponding detent position.

The fine tuning assembly 68 comprises a fine tuning control knob 70, support bracket 72, a gear 74 and an idler gear 64. As shown in FIGURE 3, the idler gear 64 is mounted on bracket 72 by shaft 66 and meshes with the gear 74. Referring to FIGURE 1, it can be seen that the entire assembly 68 is freely mounted for longitudinal movement along the control shaft 50, and bracket 72 is prevented from rotating by a support bracket keyway 78. The tuning assembly is moved into position to adjust the tuning screws 58 by depressing the control knob 70 against the force of the spring 76. In addition, the control knob 70 and the attached tuning gear 74 is free to rotate concentrically with axis of control shaft 50.

Referring to FIGURES 1 and 3, it can be seen that an inward pressure on the control knob 70 will bring the idler gear 64 to mesh with the pinion gear head 62 of one of the adjustable screws 58. By rotating the depressed control knob 70 the gear 74 will rotate idler gear 64 and preset the adjustment screw 58 to the desired channel position. The main tuning control knob 48 is then turned to the next detent position and the fine tuning process is repeated until a desired UHF channel is selected at each of the 18 detent positions.

From the view of turret 56 in FIGURE 3, it will be seen that the tuning adjustment screws are equally spaced in a circle about the turret axis. The pinion gear heads of the screws project radially into the turret into a common circular path indicated by the dot and dash line 80, in which they move to mesh successively with the idler gear 64 as the turret is rotated to each corresponding detented stop position and the fine tuning assembly 68 is depressed forwardly by the control knob 70.

Once the desired channel is selected at the corresponding detent position, the tuner is preset and retunes the television receiver to that channel each time the tuning knob 48 is rotated to that detent position.

What is claimed is:

1. A television tuning mechanism comprising in combination:

a tuner including a chassis member and a control shaft:

detent means for providing a plurality of stop positions coupled to said control shaft;

means for mounting said tuner for rotation relative to the axis of rotation of said detented control shaft; and means for rotating said tuner chassis member with respect to the detented control shaft in any of said stop positions.

2. A tuning mechanism for ultra high frequency television tuners comprising in combination:

an ultra high frequency television tuner including a chassis member and an adjustable control shaft for continuously tuning said tuner through the ultra high frequency television band;

detent means coupled to the shaft of said tuner for providing a plurality of stop positions, the number of stop positions being significantly less than the number of ultra high frequency channels whereby a plurality of television channels can be selected at each stop position;

stationary support means for mounting said chassis member to permit movement of said chassis member relative to said control shaft; and preset tuning means coupled to said control shaft for determining the location of said chassis member relative to said control shaft in each of said stop positions to tune said tuner to a desired one of said channels in each of said stop positions.

3. A tuning mechanism for a television receiver comprising in combination:

a tuner having a chassis member and a control shaft for continuous tuning throughout the frequency band;

detent means providing a plurality of controlled stop positions coupled to said tuner shaft to establish channel tuning positions;

stationary support means for mounting said tuner whereby said entire tuner chassis can be rotated about the axis of rotation of the detented control shaft at each detent stop position;

a rotary turret having a plurality of adjustable tuning control elements corresponding to the number of detent positions, said rotary turret being coupled for rotation with said control shaft; lever means acting between one of said elements and said tuner chassis member for rotating said tuner chassis member about said detented control shaft at each detent stop position;

means for rotating said control shaft and turret through the plurality of detent stop positions; and means for effecting adjustment for each of the said tuning control elements at each detent stop position.

4. A tuning mechanism as defined in claim 3 wherein: the angle of rotation of said tuner chassis by said adjustable control elements is limited to the magnitude of the angle of rotation of said control shaft between two consecutive detent positions.

5. A preset tuning mechanism for ultra high frequency television tuners comprising:

an ultra high frequency tuner including a chassis member with a rotatable tuning control shaft extending therefrom, said tuner being continuously tunable over the ultra high frequency television band for substantially 180° rotation of said tuning control shaft;

stationary support means;

means for mounting said tuner chassis member on said support means for rotation, relative to said support means, about the axis of said tuning control shaft;

detent means coupled between said tuning control shaft and said support means to provide a plurality of detent stop positions, the number of stop positions being less than half the total number of ultra high frequency television channels;

a rotary turret element coupled for rotation with said tuning control shaft and including a plurality of adjustable tuning control elements equally spaced about the periphery thereof, the number of adjustable tuning control elements corresponding to the number of detent stop positions;

follower means positioned for engagement by successive ones of said plurality of adjustable tuning control elements and coupled to said tuner chassis to control the rotational position thereof depending on the adjustment of the adjustable control elements;

resilient means for biasing said tuner chassis and said follower; and means for rotating said control shaft to successive detent positions and to bring successive ones of said adjustable control elements into engagement with said follower.

6. In a television tuner having a chassis member and a control shaft, the combination of:

detent means providing a plurality of fixed detent stop positions connected to the control shaft to rough tune said tuner to a desired location in the frequency band;

means for mounting said tuner for rotation about the axis of said detented control shaft in any of the fixed detent stop positions thereof; and fine tuning means to rotate said entire tuner chassis about said detented control shaft to tune said tuner to the desired frequency.

7. In a television tuner having a chassis member and a control shaft, the combination of:

detent means providing a plurality of equally spaced fixed detent stop positions connected to the control shaft to rough tune said tuner to a desired location in the frequency band;

means for mounting said tuner for rotation about the axis of said detented control shaft in any of the fixed detent stop positions thereof;

spring biasing means to urge said tuner chassis to a reference position with respect to said mounting means; and lever means to operate on said spring bias means causing said tuner chassis to rotate from said reference position about the axis of said detented control shaft thereby fine tuning said tuner.

8. The combination as defined in claim 7 wherein:

the angle of rotation of said tuner chassis is limited in magnitude to the angle of rotation of said control shaft between any two consecutive detent positions of said plurality of equally spaced detent stop positions.

9. In a television tuner having a chassis member and a control shaft, the combination of:

detent means providing a plurality of fixed detent stop positions connected to the control shaft to rough tune said tuner to a desired location in the frequency band;

means for mounting said tuner for rotation about the axis of said detented control shaft in any of the fixed detent stop positions thereof;

spring biasing means to urge said tuner chassis to a reference position with respect to said mounting means;

lever means to operate on said spring bias means causing said tuner chassis to rotate from said reference position about the axis of said detented control shaft thereby fine tuning said tuner;

a rotary turret having a plurality adjustable, fine tuning control elements corresponding to the number of said detent positions, rotating with said detent means for successive engagement with said lever means to control the rotational position of said tuner chassis depending on the adjustment of said adjustable fine tuning control elements; and means for rotating said control shaft to successive detent positions and to bring successive ones of said adjustable fine tuning control elements into engagement with said lever means.

References Cited by the Examiner

UNITED STATES PATENTS 3,188,871 6/1965 Mentzer ------------- 74—10

MILTON KAUFMAN, *Primary Examiner.*